(12) United States Patent
Nakamura et al.

(10) Patent No.: US 6,881,293 B2
(45) Date of Patent: Apr. 19, 2005

(54) PROCESS FOR PRODUCING A MULTI-LAYER PRINTER WIRING BOARD

(75) Inventors: Shigeo Nakamura, Kawasaki (JP); Tadahiko Yokota, Kawasaki (JP)

(73) Assignee: Ajinomoto Co., Inc., Tokyo (JP)

(*) Notice: Subject to any disclaimer, the term of this patent is extended or adjusted under 35 U.S.C. 154(b) by 201 days.

(21) Appl. No.: 10/080,408

(22) Filed: Feb. 25, 2002

(65) Prior Publication Data

US 2002/0076539 A1 Jun. 20, 2002

Related U.S. Application Data

(62) Division of application No. 09/721,664, filed on Nov. 27, 2000, now Pat. No. 6,376,053, which is a continuation of application No. 08/999,332, filed on Dec. 29, 1997, now abandoned.

(30) Foreign Application Priority Data

Dec. 26, 1996 (JP) ........................................ 1996/348448
Jun. 25, 1997 (JP) ........................................ 1997/168632
Jul. 14, 1997 (JP) ........................................ 1997/188235

(51) Int. Cl.$^7$ ............................................. B32B 31/20
(52) U.S. Cl. .................... 156/307.1; 156/330; 428/209; 428/355 EP; 428/901
(58) Field of Search ............................. 156/247, 272.8, 156/295, 307.1, 325, 330, 344; 428/343, 355 R, 355 EP, 209, 901; 523/427, 428, 429, 434; 525/109, 113, 423, 438, 455, 486, 524, 527

(56) References Cited

U.S. PATENT DOCUMENTS

| | | | |
|---|---|---|---|
| 4,882,455 A | 11/1989 | Sato et al. | |
| 4,985,294 A | 1/1991 | Watanabe et al. | |
| 5,286,330 A | 2/1994 | Azuma et al. | |
| 5,309,632 A | * 5/1994 | Takahashi et al. | ............ 29/852 |

(Continued)

FOREIGN PATENT DOCUMENTS

| | | |
|---|---|---|
| EP | -0746189 | * 12/1996 |
| GB | -2203290 | * 10/1988 |
| GB | -2259812 | * 3/1993 |

(Continued)

OTHER PUBLICATIONS

"CC–41 Build–Up Multilayer Printed Wiring Board," Electronic Packaging Technology, Apr. 1994, pp. 52–57.
Catalog of Dai Nippon Ink and Chemicals, Inc., Aug. 1996.
Catalog of Thoto Kasei Co., Ltd., Feb. 1990.
Catalog of Sumitomo Chemical Co. Ltd., Jun. 1988.
Catalog of Toyobo Co., Ltd., Jun. 2001.

*Primary Examiner*—John T. Haran
(74) *Attorney, Agent, or Firm*—Rothwell, Figg, Ernst & Manbeck, P.C.

(57) ABSTRACT

The present invention is directed to an inter-laminar adhesive composition containing a liquid epoxy resin, a polyfunctional epoxy resin having a softening point higher than a lamination temperature of the adhesive and with two or more epoxy groups within the molecule; and a latent epoxy curing agent initiating a reaction at a temperature higher than the lamination temperature. The adhesive composition optionally contains a liquid resin other than the liquid epoxy resin and/or an organic solvent and the liquid resin includes the liquid epoxy resin, the organic solvent or both constituting from 10 to 55% by weight of the composition.

This inter-laminar adhesive composition allows for the preparation of a multi-layer printed wiring board. The process for preparing the multi-layer printed wiring board is provided. The resulting multi-layer printed wiring board of the invention possesses excellent embedding properties in the internal-layer circuit, excellent surface smoothness and can be provided at high productivity levels in a building up process using the present adhesive.

35 Claims, 1 Drawing Sheet

U.S. PATENT DOCUMENTS

| | | | | |
|---|---|---|---|---|
| 5,350,621 A | * | 9/1994 | Yuhas et al. | 428/901 |
| 5,430,112 A | * | 7/1995 | Sakata et al. | 525/504 |
| 5,451,721 A | | 9/1995 | Tsukada et al. | |
| 5,599,622 A | * | 2/1997 | Kinzer et al. | 428/355 EP |
| 5,725,937 A | * | 3/1998 | Johnston | 428/209 |
| 6,040,015 A | * | 3/2000 | Nakao et al. | 427/407.1 |

FOREIGN PATENT DOCUMENTS

| | | | |
|---|---|---|---|
| JP | 112596/1992 | | 4/1992 |
| JP | 168794/1992 | | 6/1992 |
| JP | 5-17604 | * | 1/1993 |
| JP | 5-007094 | | 1/1993 |
| JP | 5-136575 | | 6/1993 |
| JP | 5-259649 | * | 10/1993 |
| JP | 111386/1995 | | 4/1995 |
| JP | 7193373 | | 7/1995 |
| JP | 7202428 | | 8/1995 |
| JP | 8064960 | | 3/1996 |
| JP | 8-064963 | | 3/1996 |
| JP | 8-157566 | * | 6/1996 |
| JP | 8204296 | | 8/1996 |
| JP | 236945 | | 9/1996 |
| JP | 8-316642 | | 11/1996 |
| JP | 8-330741 | * | 12/1996 |
| JP | 8-41140/1996 | | 9/1997 |
| JP | 9-232759/1997 | | 9/1997 |
| JP | 7-202418 | | 8/1998 |
| TW | 243583 | | 3/1995 |

* cited by examiner

PROCESS FOR PRODUCING A MULTI-LAYER PRINTER WIRING BOARD

CROSS-REFERENCE TO RELATED APPLICATIONS

This is a divisional of U.S. application Ser. No. 09/721,664 filed Nov. 27, 2000; which is now U.S. Pat. No. 6,376,053; which is a continuation of U.S. application Ser. No. 08/999,332, filed Dec. 29, 1997, now abandoned.

BACKGROUND OF THE INVENTION

1. Field of the Invention

The present invention relates to an inter-laminar film adhesive for multi-layer printed wiring boards, capable of integrally carrying out the coating process of an inner-layer circuit pattern and the filling process of a resin in a superficial via hole and/or a through-hole simultaneously on a multi-layer printed wiring board of a build-up type where a conductive layer and an insulation layer are alternatively built up; and a process for producing a multilayer printed wiring board using the same.

2. Discussion of the Background

Conventional processes for producing a multi-layer printed wiring board generally comprise lamination pressing through several prepreg sheets produced by impregnating an insulation adhesive layer glass cloth impregnated with an epoxy resin to prepare the cloth at B stage and obtaining inter-laminar communication by way of through-holes. However, the process is costly and conducts heating and molding under pressure through lamination pressing, thus requiring large equipment and a long processing time. Additionally the process requires the use of glass cloth with a relatively high dielectric constant as the prepreg sheet, which limits the ability to reduce the inter-laminar thickness. The process is also problematic because of the insulation concern due to CAF.

As one way to overcome such problems, attention has recently been focused on buildup production technique of multi-layer printed wiring boards, comprising alternately laminating an organic insulation layer on the conductor layer of an internal-layer circuit board. Japanese Patent Laid-open No. 7-202426 and 8-157566 disclose a method for producing a multi-layer printed wiring board, comprising coating and preliminarily drying an underlining adhesive on an internal-layer circuit board with a circuit formed therein and bonding a copper foil or a copper foil with an adhesive on the board.

Additionally, in Japanese Patent Laid-open No. 8-64960, a method is disclosed for producing a multi-layer printed wiring board, comprising coating and preliminary drying of an underlining adhesive and attachment of a film additive adhesive followed by curing under heating, scrubbing with an alkaline oxidant, and plating to form a conductor layer. Because the underlining adhesive layer is formed in an ink form by these methods, however, the possibility of dust contamination into the adhesive layer during the processes is high, which causes circuit failure due to disconnection and short circuiting.

As a method with no use of an underlining adhesive, Japanese Patent Laid-open No. 7-202418 discloses a method for producing a multi-layer printed wiring board, by forming an adhesive layer, comprising a high molecular epoxy resin and an epoxy resin, as liquids on a copper foil, and attaching the resulting copper foil with the adhesive onto an internal-layer circuit board. This method is problematic, however, in that the copper foil with the adhesive is readily wrinkled or damaged during lamination. Additionally, any of the above-noted methods has two major drawbacks from the respect of workability and characteristic properties of the final product, in that (1) these methods require a hole filling process, by means of a hole filling resin and the like, if through-holes are present on an internal-layer circuit board and (2) voids readily develop in superficial via holes if they are present.

SUMMARY OF THE INVENTION

Accordingly, one object of the present invention is to provide an inter-laminar adhesive film that is useful in multi-layer printed wiring boards, among other things, and gives excellent embedding properties in the internal-layer circuit.

A further object of the present invention is to provide an inter-laminar adhesive film that provides excellent surface smoothness when used in production of multi-layer printed wiring boards.

A further object of the present invention is to provide a process for production of a multi-layer printed wiring board at high productivity levels using the inter-laminar adhesive film in a build-up process.

These and other objects of the present invention have been satisfied by the discovery of an inter-laminar adhesive film for multi-layer printed wiring boards, the adhesive film being capable of integrally carrying out the coating of the internal-layer circuit pattern and the filling of a resin in the superficial via holes and/or through-holes for a build-up process of producing a multi-layer printed wiring board, and a process of producing a multi-layer printed wiring board by using the adhesive film at a high productivity level.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION OF THE PREFERRED EMBODIMENTS

Figure 1:
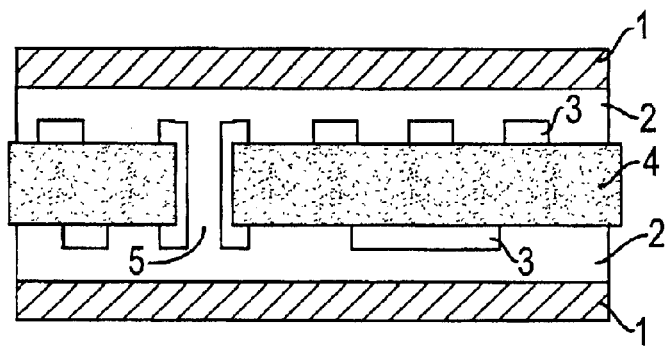
FIG. 1 depicts an appearance of the adhesive film for multi-layer printed wiring boards of the present invention, which is formed on a support base film (1) and is embedded in an internal-layer circuit board (4) with a circuit pattern and a through-hole (5).

The present invention relates to an inter-laminar adhesive film for multi-layer printed wiring boards, comprising a support film base laminated on an internal-layer circuit board having a pattern processed thereon, and a resin composition that is solid at ambient temperature (hereafter referred to as a "solid resin composition"), which is laminated on the surface, wherein the solid resin composition contains at least 10% by weight of a resin with a lower softening point than the laminate temperature and is of a thickness larger than the thickness of the electric conductor in the internal-layer circuit and resin flow of the solid resin composition at the laminate temperature satisfies on of the following: (1) it is at least of the thickness of the electric conductor of the internal-layer circuit, (2) it is of the depth of a superficial via hole if present in the internal-layer circuit, or (3) it is ½-fold or more the depth of a through-hole if present in the internal-layer circuit singly or in combination with a superficial via hole. Within the context of the present invention, when a resin is referred to as a solid resin, it indicates that the resin is solid at ambient temperatures. Conversely, if a resin is referred to as a liquid resin, it indicates that the resin is in a flowable or liquid state at ambient temperatures.

The present invention also provides a process of producing the multi-layer printed wiring board using the inter-laminar adhesive film and a process of producing the same.

When the inter-laminar adhesive film for multi-layer printed wiring boards of the present invention comprises an epoxy resin composition, the present inter-laminar adhesive film meets one of the following compositions:

(1) the solid resin composition comprises the following essential components;

(A) an epoxy resin that is liquid at ambient temperature (a liquid resin);

(B) a polyfunctional epoxy resin having a softening point higher than the laminate temperature and with two or more epoxy groups within the molecule; and (C) a latent epoxy curing agent initiating a reaction at a temperature higher than the laminate temperature; and wherein the resin composition may or may not contain a liquid resin other than the component (A) and/or an organic solvent and wherein the liquid resin including the component (A) and/or the organic solvent in total constitute from 10 to 55% by weight of the total adhesive; or (2) the solid resin composition comprises the following essential components;

(A) a liquid epoxy resin;

(B') a polyfunctional epoxy resin having a softening point lower than the laminate temperature and with two or more epoxy groups within the molecule;

(C) a latent epoxy curing agent initiating a reaction at a temperature higher than the laminate temperature; and (D) a binder polymer with a weight average molecular weight within a range of 5,000 to 100,000; and wherein the resin composition may or may not contain a liquid resin other than the component (A) and/or an organic solvent;

wherein the liquid resin including the component (A) and/or the organic solvent in total constitute from 10 to 55% by weight of the total adhesive; and wherein the component (D) is 5 to 50% by weight of the total adhesive.

The solid resin composition used in the present inter-laminar adhesive composition includes a resin composition comprising a thermosetting resin and/or a polymer as the principal component, wherein the resin composition is softened under heating and has the ability to form a film. The solid resin composition also is capable of satisfying the characteristic properties required for inter-laminar insulation materials, such as heat resistance and electric properties, after the composition is thermally set. For example, the composition includes, but is not limited to epoxy resins, acrylic resins, polyimide resins, polyamide imide resins, polycyanate resins, polyester resins, and thermosetting polyphenylene ether resins. The composition can contain these resins individually or in combinations of two or more thereof and can also be prepared as an adhesive film layer of a multi-layer structure. Among epoxy resins with a higher reliability and good cost performance as an inter-laminar insulating material, preference is given to the epoxy resin composition of the present invention as described below. Additionally, the thermosetting process can be omitted if a thermoplastic engineering plastic such as thermoplastic polyimide is used.

The solid resin composition necessarily contains at least 10% by weight of a resin with a softening point lower than the temperature during lamination. Below 10% by weight, it is difficult to embed the resin into a through-hole and/or a superficial via hole in the internal-layer circuit without occurrence of a void. Preferably, the liquid resin and/or the solid resin with a softening point lower than the laminate temperature are within a range of 10 to 90% by weight, in total.

The solid resin composition may or may not contain an inorganic component at a preferable content of 30% by weight or less. Through the addition of such inorganic compounds, an inter-laminar adhesive film for multi-layer printed wiring boards having excellent laser piercing properties can be produced.

In addition to the principal components in the resin composition, use may be made of other conventional additives. For example, use may be made of inorganic fillers such as barium sulfate, calcium carbonate, barium titanate, silicon oxide powder, amorphous silica, talc, clay, and mica powder; flame-retardant agents such as antimony trioxide and antimony pentoxide; organic-fillers such as silicon powder, nylon powder, nylon powder, and fluorine powder; thickening agents such as asbestos, orben, and benton; defoaming agents and/or leveling agents, such as silicon compounds, fluorine compounds, and polymers and adhesiveness providing agents such as imidazoles, thiazoles, triazoles, and silane coupling agents. If necessary, a desired use may be made of conventional coloring agents such as dyes and pigments, including, but not limited to, phthalocyanine blue, phthalocyanine green, iodine green, disazo yellow, titanium oxide, and carbon black. The resulting adhesive film can provide an excellent laser piercing property, by limiting the inorganic components to 30% by weight or less in the resin composition. If the inorganic components are about 30% by weight, vias with small diameters of 100 μm or less have poor shapes after the use of a $CO_2$ laser or a UV laser, with resultant poor plating adhesion thus creating a problem in connection reliability. Additionally, the laser processing rate is disadvantageously lowered from the respect of productivity.

As to the solid resin composition in the inter-laminar adhesive film for multi-layer printed wiring boards of the present invention, a most preferred embodiment comprising an epoxy resin will now be described. The liquid epoxy resin as the component (A) in accordance with the present invention is an essential component to impart flexibility to the resulting adhesive film and impart thermal flowability during lamination onto an internal-layer circuit board. More specifically, preference is given to a bisphenol A epoxy resin with an epoxy equivalent of about 200, a bisphenol F-type epoxy resin with the same level of epoxy equivalent, a phenol novolak-type epoxy resin with the same level of epoxy equivalent, or an epoxy-modified fluid rubber or rubber dispersed fluid epoxy resin. Additionally, reactive diluents such as allylglycidyl ether, glycidyl methacrylate, alkylphenyl glycidyl ether and polyhydric alcohol-type glycidyl ether and other conventional epoxy resins, such as alicyclic epoxy resins, may be used singly or in combinations of two or more thereof. Together with the other liquid resin components described below and the residual organic solvents, these liquid epoxy resins are required to be within a range of from 10 to 55% by weight in the resin composition. Below 10% by weight, the flexibility and cut processability of the resulting adhesive film are so poor that the film is barely handleable. Above 55% by weight, the fluidity of the adhesive film at ambient temperature is so high that problematic oozing occurs due to edge fusion or the support film and the protective film start to peel. A liquid resin component with a low viscosity should be used in a lower amount, while such resin component with a high viscosity should be used in a comparatively higher amount. However, the range of adding a scrubbing component corresponding to the component (E) is limited. Furthermore, the residual organic solvent is within a range of 0.3 to 10% by weight.

The "polyfunctional epoxy resin with two or more epoxy groups within the molecule" as the components (B) and (B') in accordance with the present invention is required to provide various properties such as heat resistance, chemical resistance, and/or electric properties satisfactory for an inter-laminar insulation material. The resin for use as components B and B' can be any conventional polyfunctional epoxy resin meeting the above requirements. Suitable polyfunctional epoxy resins include bisphenol A epoxy resins, bisphenol F epoxy resins, bisphenol S epoxy resins, phenol novolak epoxy resins, alkylphenol novolak epoxy resins, bisphenol epoxy resins, naphthalene epoxy resins, dicyclopentadiene epoxy resins, an epoxylated product of a condensate of phenols with an aromatic aldehyde having a phenolic hydroxyl group, triglycidyl isocyanurate, and alicyclic epoxy resins. Furthermore, use can be made of the epoxy resins after bromination, in order to impart flame retardancy. These polyfunctional epoxy resins require a component with a softening point higher than the temperature during lamination, whereby the thermal fluidity during attachment can be suppressed and the surface smoothness after heating and curing becomes excellent. Because a liquid polyfunctional epoxy resin is contained as component (B'), the range of the addition thereof is limited in the same manner as for component (A). The component is a polyfunctional epoxy resin with two or more epoxy groups within the molecule and with a softening point not higher than the laminate temperature. In order to produce an inter-laminar adhesive film for multi-layer printed wiring boards using the component (B'), the essential components thereof should be (D) a binder polymer with an average molecular weight within 5,000 to 100,000, in addition to (A) a liquid epoxy resin and (C) a latent epoxy curing agent initiating a reaction at a temperature higher than the laminate temperature. The resin composition may or may not contain a liquid resin other than the component (A) and/or an organic solvent, wherein the liquid resin including the component (A) and/or the organic solvent in total constitute from 10 to 55% by weight of the adhesive and the component (D) in the resin composition is from 5 to 50% by weight of the composition.

The component C "latent epoxy curing agent" in accordance with the present invention includes amine curing agents, guanidine curing agents, imidazole curing agents or epoxy adducts thereof or microcapsulated products thereof. An epoxy curing agent should preferably be selected having a longer pot life below ambient temperature to initiate a reaction at a temperature higher than the temperature during lamination during the elevation of the temperature, such that sufficient thermal fluidity during lamination can be maintained to readily determine the conditions for lamination. The reaction initiation temperature is defined as an exothermic peak initiation temperature measured by differential calorimetry (DSC) at a temperature elevation rate of 5° C./min, provided that 5 parts by weight of a curing agent is added to 100 parts by weight of bisphenol A diglycidyl ether (epoxy equivalent: 186–192) followed by homogenous dissolution or dispersion. The reaction initiation temperature for various exemplary compounds is as follows; dicyandiamide (initiation temperature; 165–175° C.), 2-phenyl-4-methyl-5-hydroxymethyl imidazole (initiation temperature; 135–145° C.), 2-phenyl-4,5-bis(hydroxymethyl)imidazole (initiation temperature; 145–155° C.), 2,4-diamino-6-(2-methyl-1-imidazoylethyl)-1,3,5-triazine (initiation temperature; 110–120° C.), 2,4-diamino-6-(2-methyl-1-imidazolylethyl)-1,3,5-triazine•isocyanuric acid adduct (initiation temperature; 125–135° C.), and 2,4-diamino-6-(2-undecyl-1-imidazolylethyl)-1,3,5-triazine (initiation temperature; 115–125° C.). The amounts of these latent epoxy curing agents to be added are within a range of 2 to 12% by weight of the epoxy resin. Below 2% by weight, curing is insufficient. Above 12% by weight, curing occurs too strongly so that the film gets too fragile. If the conditions for the latency and the reaction initiation temperature are provided, a phenolic curing agent and a curing promoting agent may also be used, including, for example, phenol novolak resins, alkylphenol novolak resins and curing promoting agents such as imidazole compounds and organic phosphine compounds, more preferably including tetraphenyl phosphoniumtetraphenyl borate and the like. The amount thereof to be added is adjusted as follows; phenolic hydroxyl groups should be within 0.6 to 1.0 equivalent per epoxy group in the epoxy resin; the curing promoting agent should be at 0.5 to 2% by weight of the total of the two resins. Furthermore, the individual latent epoxy curing agents described above may be used singly or in combinations of two or more thereof or in combination with conventional curing promoting agents.

In order to improve the mechanical strength and flexibility of the adhesive film for better handling, the component (D), namely the "binder polymer with a weight average molecular weight within a range of 5,000 to 100,000" is required. If the weight average molecular weight is below 5,000, the effect on improving the mechanical strength and flexibility cannot be exerted; above 100,000, the solubility of the binder in an organic solvent and the miscibility of the binder with an epoxy resin are deteriorated, so that the resulting film cannot be used. Preferably, the amount of component D to be added is within a range of 5 to 50% by weight. Below 5% by weight, the mechanical strength and flexibility are not improved. Above 50% by weight, the thermal fluidity of the resulting film is deteriorated. Because the thermal fluidity of the resulting film can be suppressed when the film contains component D, the polyfunctional epoxy resin with a softening point higher than the laminate temperature is not essential. Additionally, the binder polymer helps prevent crossing over the support film. More specifically, the binder polymer includes, but is not limited to phenoxy resins, which can be optionally brominated, polyacrylic resins, polyamide resins, polyamide imide resins, polycyanate resins, polyester resins, and thermosetting polyphenylene ether resins. These can be used singly or in combinations of two or more thereof.

In order to efficiently perform wet scrubbing with an oxidant, on the film surface after the adhesive film is cured under heating, at least one scrubbing component selected from oxidant-soluble rubber components, amino resins, inorganic fillers and organic fillers is necessary. Examples of suitable rubber components include polybutadiene rubber, modified polybutadiene rubber such as epoxy modified, urethane modified, and (meth)acrylonitrile modified polybutadienes, and further includes (meth) acrylonitrile butadiene rubber containing carboxyl groups and epoxy resins of acrylic rubber-dispersed type. Suitable amino resins include melamine resins, guanamine resins, urea resins and alkyl etherified resins thereof. Suitable inorganic fillers include calcium carbonate, magnesium carbonate and magnesium oxide. Suitable organic fillers include powdery epoxy resins and cross-linked acrylic polymers, and additionally includes the aforementioned amino resins after thermal curing and fine grinding. These scrubbing components are preferably used within a range of 5 to 40% by weight in the resin composition. Below 5% by weight, the scrubbing potency is insufficient, while above 40% by weight, the electric properties, chemical resistance and thermal resistance of the resulting film are so poor that the film cannot be practically used as an inter-laminar insulation material. Also, the additive resin composition includes a component (F) which is a catalyzer for non-electro-plating with metal, and is used as an additive inter-laminar adhesive film having good properties for wet plating. The examples of the catalyzer include a metal powder such as palladium, gold, platinum, silver, copper, cobalt, tin and/or its halide, oxide, hydroxide, sulfide, peroxide, amine salt, sulfate, nitrate, salt of organic acid, and chelates thereof. An inorganic material coordinated with one or more other metal(s) and/or its compound are preferably used as catalyzer. The examples of the inorganic materials include powder of alumina or carbon and so on. A diameter of the powder is within a range of from 0.1 to 50 $\mu$m. The catalyzer is preferably within a range of 0.05 to 3% by weight in the resin composition.

An inter-laminar adhesive film having a two-layer structure for multi-layer printed wiring boards, with no such upper limit of the scrubbing component, is produced by laminating together a solid scrubbable resin composition essentially comprising the following components;

(A) a polyfunctional epoxy resin with two or more epoxy groups within the molecule;

(B) an epoxy curing agent; and (C) at least one scrubbing component selected from the group consisting of a rubber component, amino resins, inorganic fillers and organic fillers, and the resin composition described above in accordance with the present invention, whereby the surface scrubbing potency with an oxidant and the reliability as an inter-laminar insulation material can be imparted in a simple fashion to the resulting adhesive film. The thickness of the scrubbable resin composition is preferably less than half of the total film thickness, more preferably within a range of 1 to 15 $\mu$m, with respect to the flexibility and fine patterning of the resulting film and the reliability of the inter-laminar insulation. As the polyfunctional epoxy resin to be used as component (A), use is made of those described above, with no preference for liquid or solid. As the epoxy curing agent, use is made of conventional curing agents such as amines, guanidines, imidazoles and acid anhydrides or epoxy adducts thereof. As the scrubbing agent, use is made of the same compounds as component (E) at 5% by weight or more. And the catalyzer for non-electro-plating with metal (F) is added to the resin composition at 0.05% by weight or more.

The inter-laminar adhesive film in accordance with the present invention can be prepared by coating a resin-varnish dissolved in an organic solvent using a base film as a support, drying the solvent by heating and/or hot air spraying to prepare a solid resin composition. The support base film includes polyolefins, such as polyethylene and polyvinyl chloride; polyesters, such as polyethylene terephthalate; polycarbonates; as well as release papers and metal foils such as copper foil and aluminum foil. The thickness of the support base film is preferably 10 to 150 $\mu$m. The support base film is further processed with a release process (other than a mud process and a corona process). As the organic solvent, use may be made of ketones such as acetone, methyl ethyl ketone, and cyclohexane; acetate esters such as ethyl acetate, butyl acetate, Cellosolve acetate, propylene glycol monomethyl ether acetate, and Carbitol acetate; Cellosolves such as Cellosolve and butyl Cellosolve; Carbitols such as Carbitol and butyl Carbitol; aromatic hydrocarbons such as toluene and xylene; and additionally dimethylformamide, dimethylacetoamide, and N-methyl pyrrolidone, singly or in combination of two or more thereof. The amount of the residue organic solvent is defined as weight decrement ratio, prior to and after drying in a dryer kept at 20° C. for 30 minutes.

The thickness of the solid resin composition is above the thickness of the conductor on the internal-layer circuit board to be laminated, and varies depending on the residual copper ratio in the internal-layer circuit pattern, the board thickness, the through-hole diameter, the superficial via hole diameter, the number of holes and the preset value of the thickness of the insulation layer. Preferably, the thickness is within a range of the conductor thickness plus 10 to 120 $\mu$m. If the board thickness is large and the resin filled volume of the through-hole is large, a thicker resin composition is necessary. The thus formed adhesive film of the present invention, comprising the solid resin composition and the support base film is stored, as it is or is stored after a protective film is further laminated on the other face of the resin composition and is then rolled in. Suitable protective films include the same as for the support base film, for example, polyolefins such as polyethylene, polyvinyl chloride, and polypropylene; polyesters such as polyethylene terephthalate; and release papers. The thickness of the protective film is preferably 10 to 100 $\mu$m. Furthermore, the protective film may satisfactorily be processed at a release process in addition to the mud process and emboss process. As described below, the resin in the resin composition oozes during lamination, so that a portion of the support base film should be arranged at a width of about 5 mm or more on both ends or a single end of the roll to prevent resin adhesion onto the laminate part and to permit peeling of the support base film to be readily done.

With reference to the drawings, a multi-layer printed wiring board using the inter-laminar adhesive film of the present invention and a process for fabricating the board will now be described. For attaching the adhesive film of the present invention onto a pattern processed internal-layer circuit board, the protective film, if present, is removed, and then, the solid resin composition (2) is laminated under pressure and heating (FIG. 1). By laminating under conditions such that the resin flow during lamination is above the thickness of the conductor (3) of the internal-layer circuit and above half of the through-hole (5) depth and/or the superficial via hole depth of the internal-layer circuit, the coating of the internal-layer circuit pattern and the resin filling in the superficial via hole can be done simultaneously and integrally. As the internal-layer circuit board (4), use is made of glass epoxy and metal boards, polyester boards, polyimide boards, thermosetting polyphenylene ether boards and the like. The circuit surface may preliminarily be subjected to a scrubbing process, if desired. Under reduced pressure, the lamination is performed by batch-wise process or continuously by means of a roll. Preferably, both the surfaces are laminated.

As described above, the lamination conditions can vary, depending on the thermal melt viscosity and thickness of the solid resin composition of the present invention, the through-hole diameter and depth of the internal-layer circuit board, and/or the superficial via hole diameter and depth. Generally, the temperature for contact boarding is 70 to 200° C.; and the pressure therefor is 1 to 10 kgf/cm². Lamination is preferably done under reduced pressure of 20 mmHg or less. If the through-hole diameter is large and deep or if the board is of a larger thickness, the resulting resin composition is so thick that lamination conditions at a high temperature and/or a high pressure are required. Generally, a board thickness up to about 1.4 mm and a through-hole diameter up to about 1 mm are appropriate for good resin filling. The surface smoothness of the resin composition after lamination is better when the support base film (1) is thicker, which is, however, disadvantageous for embedding the resin in-between the circuit pattern with no voids. Preferably, therefore, the support base film (1) has a thickness the same as the conductor (3) thickness plus or minus 20 μm. When the surface smoothness and thickness of the resin on the pattern are not sufficient because the conductor thickness on the internal-layer circuit is thick or when a recess develops in the hole because the diameters of the through-hole and the superficial via hole are too large, the inter-laminar adhesive film should be further laminated thereon. After lamination, the film is cooled to around ambient temperature to peel off the support base film.

Figure 2:
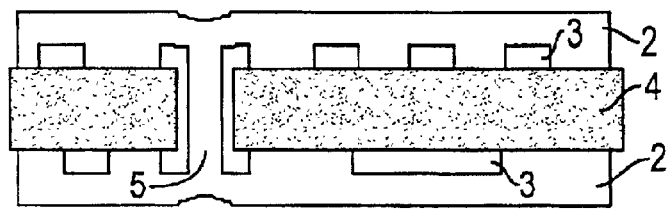
FIG. 2 depicts an appearance of the adhesive film for multi-layer printed wiring boards after the process of FIG. 1, at an embedded state in an internal-layer circuit board (4) from which is peeled off a support base film (1), at a prestage to form a copper foil or a conductor layer through plating.

After laminating the inter-laminar adhesive film for multi-layer printed wiring boards (FIG. 2), the resin composition (2) is thermally cured if necessary, and then, a copper foil with an adhesive thereon or a copper foil is further laminated as an upper layer thereof under heating, thereafter integrating them all to prepare a multi-layer printed wiring board. The curing conditions under heating can vary, depending on the types of materials of the internal layer circuit board and the curing temperature of the copper foil having an adhesive thereon if used. The curing conditions are preferably selected within the ranges of 120 to 200° C. and 20 to 90 minutes.

Figure 3:
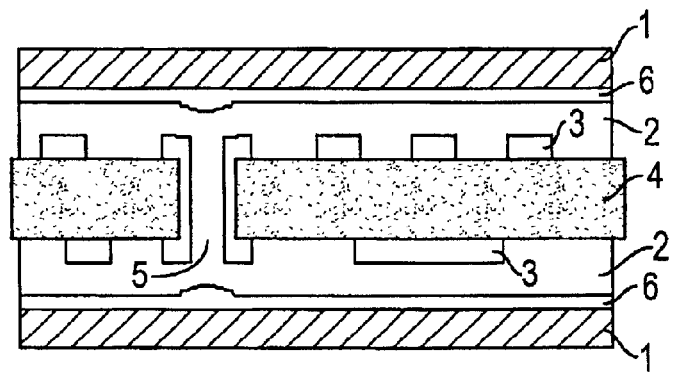
FIG. 3 depicts an appearance such that the scrubbable resin composition (6) and the inter-laminar adhesive film for multi-layer printed wiring boards, formed on the support base film (1), are at a state of being embedded in the internal-layer circuit board (4) with a circuit pattern and a through-hole (5).
Figure 4:
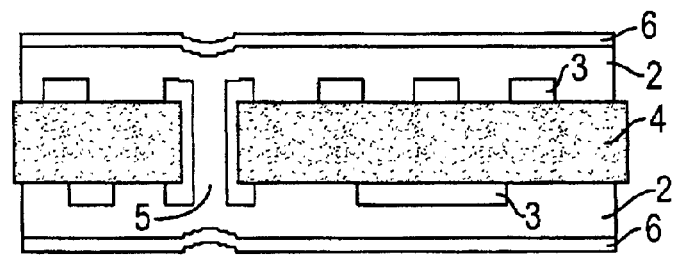
FIG. 4 depicts an appearance of the adhesive film for multi-layer printed wiring boards after the process of FIG. 1, at an embedded state in an internal-layer circuit board (4) from which is peeled off a support base film (1), at a prestage to form a copper foil or a conductor layer through plating.

In a further embodiment of the adhesive film according to the present invention, the adhesive film is laminated on an internal-layer circuit board (4) with a pattern processed, in the same manner as described above, so that the resin composition containing the scrubbing component (6) or catalyzer might be on the outer side (FIGS. 3 and 4). Thereafter, if necessary, the film is cured under heating, and a given through-hole and/or via hole part is pierced by laser or drilling, and the surface of the resin composition is scrubbed using a wet and/or dry process, if necessary. Then, the conductor layer is formed by dry plating and/or wet plating, to prepare a multi-layer printed wiring board. The thermal curing conditions are preferably selected within ranges of 120 to 200° C. and 10 to 90 minutes. The dry scrubbing process of the surface of the resin composition includes mechanical polishing with a polishing means such as an abrasive pad, sandblasting, plasma etching and the like. Alternatively, the wet scrubbing process includes chemical processes with oxidants such as permanganese salts, dichromate salts, ozone, perhydrogen oxide/sulfuric acid, nitric acid and the like. When an adhesive film containing a scrubbing component soluble in an oxidant or an adhesive film of a two-layer structure with a scrubbable resin composition formed on the surface is attached, the scrubbing process with oxidants can be efficiently carried out. After preparing an anchor with protrusions and recesses on the surface of the resin composition, if necessary, a conductor layer is formed through dry plating such as vapor deposition, sputtering and ion plating, and/or wet plating such as non-electrolytic or electrolytic plating.

In a further embodiment, the adhesive film of the present invention is laminated on an internal-layer circuit board with a pattern processed in the same manner as described above, so that the resin composition containing the scrubbing component or the catalyzer for non-electro-plating with metal might be on the outer side (FIGS. 3 and 4). The resin composition including the catalyzer for non-electroplating with metal is preferred for the additive method which produces an inter-laminar adhesive film for multi-layer printed wiring boards because of the use of non-electroplating. Then, a plated resist with a pattern reverse to that of a conductor layer may be formed to form the conductor layer only through non-electrolytic plating. After the conductor layer is thus formed, followed by an annealing process at 130 to 200° C. for 10 to 60 minutes, the curing of the thermosetting resin progresses so that the via strength of the conductor layer can be further improved.

A multi-layer printed wiring board produced by using the inter-laminar adhesive film of the present invention has such excellent surface smoothness, that the process as described above can be repeated multiple times to laminate a build-up layer in multiple steps to prepare a multi-layer printed wiring board.

EXAMPLES

The present invention will be describe specifically in the following production examples, examples and comparative examples, but the invention is not limited to these examples. The assessment method is as follows:
Flowability at ½ depth of through-hole, through-hole embedding, via hole embedding, and embedding of conductor thickness in between circuit.
By observation of resin shape on cross section. The term "good" means the state where resin is filled in the hole or in between the circuit.
Plane Smoothness on Circuit
The surface roughness on the circuit of A and B coupons defined according to the IPC standard was measured according to JISB 0601.
Heat Resistance of Solder
After immersion in a solder bath at 260° C. for 60 seconds, the immersed matter was drawn up to observe visually the solder status. The term "good" means no abnormality in the solder status.

EXAMPLE 1

Thirty parts by weight of a fluid bisphenol A epoxy resin (with an epoxy equivalent of 185, Epicoat 828 EL manufactured by Oil Shell Epoxy, Co., Ltd.) As the component A (the amount to be blended is hereinafter represented in parts by weight), 20 parts by weight of a bisphenol A epoxy resin (with an epoxy equivalent of 2000 and a softening point of 124° C., Epicion 7051 manufactured by Dai-Nippon Ink Chemistry, Co., Ltd.) as the component B, and 40 parts by weight of a brominated bisphenol A epoxy resin (with an epoxy equivalent of 499, a softening point of 75° C. and a bromide content of 21% by weight, YDB-500 manufactured by Toto Chemical Industry, Co., Ltd.) were dissolved in methyl ethyl ketone (abbreviated as MEK hereinafter) under heating and agitation, to which were added epoxy curing agents as the component (C), namely 4 parts by weight of 2,4-diamino-6-(2-methyl-1-imidazolylethyl)-1,3,5-triazine isocyanuric acid adduct, 2 parts by weight of finely ground silica and 4 parts by weight of antimony trioxide to prepare a resin composition varnish. The varnish was coated on a polyethylene terephthalate (abbreviated as PET hereinafter) film of a thickness of 30 $\mu$m to a final dried thickness of 50 $\mu$m by means of a roller coater, followed by drying at 80 to 100° C. for 10 minutes, to prepare an adhesive film (at a content of the residual solvents at 0.5% by weight). The film was folded at an angle of 180 degrees so as to assess the flexibility, and no abnormalities such as cracks were found in the resin part.

EXAMPLE 2

Twenty parts by weight of a fluid bisphenol A epoxy resin (Epicoat 828 EL manufactured by Oil Shell Epoxy, Co., Ltd.) as the component A, 20 parts by weight of a brominated bisphenol A epoxy resin (YDB-500, manufactured by Toto Chemical Industry, Co., Ltd.) And 20 parts by weight of cresol novolak epoxy resin (with an epoxy equivalent of 215 and a softening point of 78° C.; Epiclon N-673, manufactured by Dai-Nippon Ink Chemistry, Co., Ltd) as the component B', and 15 parts by weight of a polybutadiene rubber with its terminus epoxylated (Denalex R-45EPT, manufactured by Nagase Chemical Industry, Co., Ltd.) were dissolved in MEK under heating and agitation, to which were added 50 parts by weight of a brominated phenoxy resin varnish (at a non-volatile content of 40% by weight and a bromide content of 25% by weight in a solvent composition of xylene: methoxypropanol: methyl ethyl keton=5:2:8, YPB-40-PXM40, manufactured by Toto Chemical Industry, Co., Ltd.) as the component (D), epoxy curing agents as the component (C), namely 4 parts by weight of 2,4-diamino-6-(2-methyl-1-imidazolylethyl)-1,3,5-triazine isocyanuric acid adduct, and 2 parts by weight of finely ground silica and 4 parts by weight of antimony trioxide, and 5 parts by weight of calcium carbonate as the component (E) to prepare a resin composition varnish. The varnish was coated on a PET film at a thickness of 38 $\mu$m to a final dried thickness of 70 $\mu$m by means of a roller coater, followed by drying at 80 to 100° C. for 12 minutes to prepare an adhesive film (at a content of the residual solvents at 2% by weight). The film was folded at an angle of 180 degrees so as to assess the flexibility, and no abnormalities such as cracks were found in the resin part.

EXAMPLE 3

The resin composition varnish as described in Example 2 was coated on a PET film of a thickness of 50 $\mu$m to a final dried thickness of 100 $\mu$m by means of a roller coater, followed by drying at 80 to 120° C. for 13 minutes to prepare an adhesive film (at a content of the residual solvents at 4% by weight). The film was folded at an angle of 180 degrees so as to access the flexibility, and no abnormalities such as cracks were found in the resin part.

EXAMPLE 4

Fifty parts by weight of a brominated bisphenol A epoxy resin (YDB-500 manufactured by Toto Chemical Industry Co., Ltd.) as the component (A) and 25 parts by weight of a polybutadiene rubber with its terminus epoxylated (Denalex R-4SEPT manufactured by Nagase Chemical Industry, Co., Ltd.) as the component (C) were dissolved in MEK under heating and agitation to which were added epoxy during agents as the component (B), namely 3 parts by weight of 2-ethyl-4-methyl imidazole, 2 parts by weight of finely ground silica and 20 parts by weight of calcium carbonate as the component (C) to prepare a resin composition varnish. The varnish was coated on a PET film of a thickness of 38 $\mu$m to a final dried thickness of 5 $\mu$m by means of a roller coater, followed by drying at 80 to 100° C. for 5 minutes for semi-curing to prepare a scrubbable resin composition (at a content of the residual solvents at less than 0.1% by weight). Furthermore, the resin composition varnish from Example 1 was coated thereon to a final dried thickness of 60 $\mu$m by means of a roller coater, followed by drying at 80 to 100° C. for 12 minutes to prepare an adhesive film of a two-layer structure comprising resin compositions (at a content of the residual solvents of 1.5% by weight). The film was folded at an angle of 180 degrees so as to assess the flexibility, and no abnormalities such as cracks were found in the resin part.

EXAMPLE 5

Forty-five parts by weight of a thermosetting allylated polyphenylene ether resin and 15 parts by weight of diallyl phthalate monomer as the component (D), 10 parts by weight of a fluid bisphenol A epoxy resin (Epicoat 828 EL manufactured by Oil Shell Epoxy, Co., Ltd.) as the component (A), and 20 parts by weight of a cresol novolak epoxy resin (Epicon N-673, manufactured by Dai Nippon Ink Chemistry, Co., Ltd.) as the component B' were dissolved in MEK under heating and agitation to which were added 2 parts by weight of dicyandiamide, 0.5 part by weight an organic peroxide (Perbutyl P, manufactured by Nippon Yushi, Co., Ltd.), 2 parts by weight of finely ground silica and 0.5 part by weight a silicon leveling agent as the epoxy curing agents as the component C to prepare a resin composition varnish. In the same manner as in Example 4, a scrubbable resin composition of a thickness of 5 $\mu$m was formed on a PET film. Still further, the resin composition varnish was coated thereon to a final dried thickness of 70 $\mu$m by means of a roller coater, followed by drying at 80 to 100° C. for 12 minutes to prepare an adhesive film of a two-layer structure comprising the resin compositions (at a content of the residual solvents at 2.5% by weight). The film was folded at an angle of 180 degrees so as to assess the flexibility, and no abnormalities such as cracks were found in the resin part.

EXAMPLE 6

Ten parts by weight of a fluid bisphneol A epoxy resin (Epicoat 828 EL manufactured by Oil Shell Epoxy, Co., Ltd.) and 60 parts by weight of a brominated bisphenol A epoxy resin (YDB-500, manufactured by Toto Chemical Industry, Co., Ltd.) as the component (A) were dissolved in MEK under heating and agitation to which were added 2 parts by weight of 2-ethyl-4-methyl imidazole as the epoxy curing agents as the component (B), 2 parts by weight of a finely ground silica and as the component (C), 2 parts by weight of Pd and $PdCl_2$ mixed powder (PD:$PdCl_2$=1:1 by weight) to prepare a resin composition varnish. The resin composition varnish was coated on a PET film to a dried thickness of 5 μm by means of a roller coater, followed by drying at 80 to 100° C., for 5 minutes to prepare an additive resin composition film (the amount of residual solvents was below 0.1% by weight). Furthermore, the resin composition varnish from Example 1 was coated to a final dried thickness of 60 μm by means of a roller coater, followed by drying at 80 to 100° C., for 12 minutes, to prepare an adhesive film of a two-layer structure comprising resin composition (the amount of the residual solvents was 1.5% by weight).

The film was folded at an angle of 180 degrees so as to assess the flexibility, and no abnormalities such as cracks were found in the resin parts.

PRODUCTION EXAMPLE 1

The adhesive film recovered in Example 1 was laminated simultaneously on both the surfaces of each of the glass epoxy internal-layer circuit boards shown in Table 1. Preferable conditions for filling resins in through-holes with no void were as follows: For a continuous process, the roll temperature was 100° C.; the pressure was 3 kgf/cm$^2$; the rate was 30 cm/minute and the vapor pressure was 2 mmHg or less. For a batch process, the roll temperature was 80° C.; the pressure was 1 kgf/cm$^2$ and the vapor pressure was 2 mmHg or less after 5-sec pressing. After standing around ambient temperature, the PET film was peeled off, and then, a commercially available copper foil with an adhesive thereon was attached for integral curing at 170° C. for 60 minutes to prepare a four-layer printed wiring board. Thereafter, a given through-hole part and a given via hole part were pierced with a drill and/or laser, followed by non-electrolytic and/or electrolytic plating to prepare a four-layer printed wiring board according to a subtractive process. The resulting printed wiring board was soldered at 260° C. for 60 seconds, and the heat resistance against soldering was observed, with no abnormality.

PRODUCTION EXAMPLE 2

The adhesive film recovered in Example 2 was laminated simultaneously on both the surfaces of each of the glass epoxy internal-layer circuit boards shown in Table 1 by means of a vacuum laminator. Preferable conditions for filling resins in through-holes with no void were as follows: For a continuous process, the roll temperature was 110° C.; the pressure was 3 kgf/cm$^2$; the rate was 30 cm/minute and the vapor pressure was 30 mmHg or less. For a batch process, the roll temperature was 85° C.; the pressure was 1 kgf/cm$^2$ and the vapor pressure was 2 mmHg or less after 5-sec pressing. After standing around ambient temperature, the PET film was peeled off followed by thermal curing at 150° C. for 30 minutes, and thereafter, a given via hole part by weight Φ0.10 was pierced with $CO_2$ laser. Then, the surface of the resin composition was subjected to a scrubbing process with an alkaline oxidant of permanganese salt, and a conductor layer was formed over the entire surface through non-electrolytic and/or electrolytic plating to prepare a four-layer printed wiring board according to a subtractive process. Subsequently, the board was subjected to an annealing process at 150° C. for 30 minutes to stabilize the adhesion strength of the conductor. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 3

The adhesive film recovered in Example 3 was laminated simultaneously on both the surfaces of each of the glass epoxy internal-layer circuit boards shown in Table 1 by means of a vacuum laminator. Preferable conditions for filling resins in through-holes with no void were as follows: For a continuous process, the roll temperature was 110° C.; the pressure was 3 kgf/cm$^2$; the rate was 25 cm/minute; and the vapor pressure was 30 mmHg or less. For a batch process, the roll temperature was 90° C.; the pressure was 1 kgf/cm$^2$ and the vapor pressure was 2 mmHg or less after 6-sec pressing. After standing around ambient temperature, the PET film was peeled off followed by thermal curing at 150° C. for 30 minutes, and thereafter, a given via hole part by weight Φ0.10 was pierced with $CO_2$ laser. Then, the surface of the resin composition was subjected to a scrubbing process with an alkaline oxidant of permanganese salt to form a plated resist of a reverse pattern to that of the conductor layer to prepare a four-layer printed wiring board according to an additive process. Subsequently, the board was subjected to an annealing process at 150° C. for 60 minutes to stabilize the adhesion strength of the conductor. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 4

The adhesive film recovered in Example 4 was laminated simultaneously on both the surfaces of each of the glass epoxy internal-layer circuit boards shown in Table 1 by means of a vacuum laminator. Preferable conditions for filling resins in through-holes with no void were as follows: For a continuous process, the roll temperature was 100° C.; the pressure was 3 kgf/cm$^2$; the rate was 30 cm/minute; and the vapor pressure was 30 mmhg or less. For a batch process, the roll temperature was 80° C.; the pressure was 1 kgf/cm$^2$ and the vapor pressure was 2 mmHg or less after 5-sec pressing. After standing around ambient temperature, the PET film was peeled off followed by thermal curing at 170° C. for 30 minutes, and thereafter, a given via hole part and a given through-hole part were pierced with a drill and/or laser. Then, the surface of the resin composition was subjected to a scrubbing process with an alkaline oxidant of permanganese salt, and a conductor layer was formed on the entire surface through non-electrolytic and/or electrolytic plating to prepare a four-layer printed wiring board according to a subtractive process. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 5

The adhesive film recovered in Example 5 was laminated simultaneously on both the surfaces of each of the glass epoxy internal-layer circuit boards shown in Table 1 by means of a vacuum laminator. Preferable conditions for filling resins in through-holes with no void were as follows: For a continuous process, the roll temperature was 120° C.; the pressure was kgf/cm$^2$; the rate was 35 cm/minute; and the vapor pressure was 30 mmHg or less. For a batch process, the roll temperature was 95° C.; the pressure was 1 kgf/cm$^2$ and the vapor pressure was 2 mmHg or less after 6-sec pressing. After standing around ambient temperature, the PET film was peeled off followed by thermal curing at 180° C. for 60 minutes, and thereafter, a given via hole part and a given through-hole part were pierced with a drill and/or laser. Then, the surface of the resin composition was subjected to a scrubbing process with an alkaline oxidant of permanganese salt to form a plated resist of a reverse pattern to that of the conductor layer to prepare a four-layer printed wiring board according to an additive process. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 6

By means of a vacuum laminator, the adhesive film recovered in Example 2 was laminated simultaneously on both the faces of an internal-layer circuit board comprising the four-layer printed wiring board produced in the Production Example 2, having a board thickness of 0.09 mm and a conductor thickness of 25 μm and with a superficial via hole of Φ0.10. Preferable conditions for filling resins in the superficial via hole with no void were as follows: For a continuous process, the roll temperature was 110° C.; the pressure was 1.5 kgf/cm$^2$; the rate was 25 cm/minute; and the vapor pressure was 30 mmHg or less. For a batch process, the roll temperature was 85° C.; the pressure was 1 kgf/cm$^2$ and the vapor pressure was 2 mmHg or less after 5-sec pressing. After standing around ambient temperature, the PET film was peeled off followed by thermal curing at 150° C. for 30 minutes. Thereafter, a given via hole part of Φ0.10 and the like were pierced with $CO_2$ laser. Then, the surface of the resin composition was subjected to a scrubbing process with an alkaline oxidant of permanganese salt, and then, non-electrolytic and/or electrolytic copper plating was done on the whole surface thereof, to prepare a conductor layer. Subsequently, a pattern was formed according to a subtractive process, followed by an annealing process at 50° C. for 30 minutes to prepare a six-layer printed wiring board. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 7

The adhesive film recovered in Example 2 was laminated simultaneously on both the faces of each of the internal-layer circuit boards shown in Table 1 by means of a vacuum laminator, in the same manner as in the Production Example 2. The PET film was peeled off followed by thermal curing at 150° C. for 30 minutes. Thereafter, a given via hole part by weight Φ0.10 was pierced with $CO_2$ laser. Then, a copper foil of a thickness of 0.2 μm was formed on the resin composition by a sputtering process, followed by the formation of a conductor layer on the whole surface by electrolytic copper plating to prepare a four-layer printed wiring board by a subtractive process, followed by an annealing process at 150° C. for minutes to stabilize the adhesion strength of the conductor. The via strength of the conductor was 1.0 kg/cm or more. The resulting printed wiring board was soldered at 260° C. for 60 seconds, and the heat resistance against soldering was observed, with no abnormality.

PRODUCTION EXAMPLE 8

The adhesive film recovered in Example 6 was laminated simultaneously on both the surfaces of each of the glass epoxy internal-layer circuit boards shown in Table 1 by means of a vacuum laminator. Preferable conditions for filling resins in through-holes with no void were as follows: For a continuous process, the roll temperature was 100° C.; the pressure was 3 kgf/cm$^2$; the rate was 30 cm/minute; and the vapor pressure was 30 mmHg or less. For a batch process, the roll temperature was 80° C.; the pressure was 1 kgf/cm$^2$ and the vapor pressure was 2 mmHg or less after 5-sec pressing. After standing around ambient temperature, the PET film was peeled off followed by thermal curing at 170° C. for 30 minutes, and thereafter, a given via hole part and a given through-hole part were pierced with a drill and/or laser. Then, the surface of the resin composition was subjected to a desmearing process with an alkaline oxidant of permanganese salt, and a conductor layer was formed on the entire surface through non-electrolytic and/or electrolytic plating to prepare a four-layer printed wiring board according to an additive process. The via strength of the conductor was 1.0 kg/cm or more. The resulting printed wiring board was soldered at 260° C. for 60 seconds, and the heat resistance against soldering was observed, with no abnormality.

COMPARATIVE EXAMPLES 1 AND 2

In the same manner as in Example, 1, an adhesive film was prepared (at a residual solvent content of 0.5% by weight) except that the amount of the fluid bisphenol A epoxy resin as the component (A) to be added was reduced to 5 parts (Comparative Example 1) or was elevated to 120 parts (Comparative Example 2). For assessing the flexibility, the resulting film of Comparative Example 1 (at a fluid content of 7% by weight) was folded at an angle of 180 degrees. Cracking occurred in the adhesive layer, and due to such insufficient flexibility, the film was very difficult to handle. The film of Comparative Example 2 (at a content of the fluid component being 63% by weight) was highly fluid at ambient temperature, involving oozing because of edge fusion, so that the film could not be handled as film.

COMPARATIVE EXAMPLE 3

In the same manner as in Example 1, an adhesive film was prepared (at a residual solvent content of 0.5% by weight) except that the whole amount of the bisphenol A epoxy resin (Epicon 7051 manufactured by Dai-Nippon Ink Chemistry, Co., Ltd.) as the component (B) was replaced with 60 parts by weight of a brominated bisphenol A epoxy resin (YDB-500 manufactured by Toto Chemical Industry, Co., Ltd.). For assessing the flexibility, the resulting film was folded at an angel of 180 degrees. No abnormalities such as cracking occurred in the resin part.

COMPARATIVE EXAMPLE 4

In the same manner as in Example 2, an adhesive film was prepared (at a residual solvent content of 2% by weight; 42% by weight of the scrubbing component and 36% by weight of the inorganic component as the (E)), except that the amount of calcium carbonate as the component (E) was elevated to 50 parts by weight. For assessing the flexibility, the resulting film was folded at an angle of 180 degrees. No abnormality including cracking occurred in the resin part.

COMPARATIVE PRODUCTION EXAMPLE 1

The adhesive film prepared in Comparative Example 1 was laminated simultaneously on both the faces of the same glass epoxy internal-layer circuit board as in the Production Example 1 by means of a vacuum laminator. Under the same lamination conditions as in the Production Example 1, namely at a roller temperature of 100° C. and a rate of 30 cm/minute for a continuous process and a temperature of 80°

C. for batch process, the laminate temperature of the resin composition of the adhesive film was less than 75° C. At the maximum roll pressure of 8 kgf/cm² for a continuous process and at the maximum roller pressure of 6 kgf/cm² for a batch process, voids remained in the through-hole, which could not be filled with the resin.

COMPARATIVE PRODUCTION EXAMPLE 2

The adhesive film prepared in Comparative Example 3 was laminated simultaneously on both the faces of the same glass epoxy internal-layer circuit board as in the Production Example 1 by means of a vacuum laminator. Under the same lamination conditions as in the Production Example 1, resin oozing occurred strongly, so that the film could not be laminated at a uniform resin thickness on the internal-layer circuit. Additionally, resin cissing occurred on the conductor during curing under heating, so that a more non-uniform thickness is caused.

COMPARATIVE PRODUCTION EXAMPLE 3

The adhesive film prepared in Comparative Example 4 was laminated simultaneously on both the faces of the same glass epoxy internal-layer circuit board as in the Production Example 2 by means of a vacuum laminator. Preferable conditions for filling resins in through-holes with no void were as follows: For a continuous process, the roll temperature was 115° C.; the pressure was 3 kgf/cm²; the rate was 25 cm/minute and the vapor pressure was 30 mmHg or less. For a batch process, the roll temperature was 90° C.; the pressure was 1 kgf/cm² and the vapor pressure was 2 mmHg or less after 5-sec pressing. After standing around ambient temperature, the PET film was peeled off, for subsequent curing at 150° C. for minutes. Thereafter, a given through-hole part of Φ0.10 was pierced with $CO_2$ laser. The opening of the via was at about 0.01 mm, but the bottom was less than the half, and the via side wall was fragile, which means no reliability in the plating process. Additionally, piercing of a via hole of Φ0.10 was attempted by means of UV laser, but compared with the film of Example 2, the resulting via side wall was dirty and the processing time was long. Then, the surface of the adhesive was subjected to a scrubbing process with an alkaline oxidant of permanganese salt to form a conductor layer on the whole surface by non-electrolytic and/or electrolytic plating, and then prepare a four-layer printed wiring board according to a subtractive process. The resulting via strength of the conductor was 1.0 kg/cm or more. The printed wiring board was soldered at 260° C. for 60 seconds, and the heat resistance against soldering was observed. Abnormalities including expansion and conductor peeling were observed.

The results of Examples 1 to 6 and Production Examples 1 to 8 indicate that the coating of an internal-layer circuit pattern and/or the resin filling in superficial via holes can be integrally and simultaneously carried out in accordance with the present invention and that a multi-layer printed wiring board can be prepared at a high productivity by using the same. The results of Comparative Examples 1 and 2 indicate that to handle the epoxy resin composition of the present invention as film, the fluid component should importantly be within a range of 10 to 55% by weight in the resin composition. The results of Comparative Production Example 1 additionally indicate that at a content of a resin with a softening point lower than the laminate temperature being less than 10% by weight in the resin composition, even a higher laminate pressure can hardly embed resin with no void in the through-hole; if no component suppressing thermal fluidity during lamination was contained as in Comparative Production Example 2, good lamination could not be effected. If scrubbing component with poor heat resistance and poor chemical resistance was contained at 40% by weight or more as in Comparative Production Example 3, the resulting film could not be used practically as an inter-laminar insulation material, though the via strength of the resulting plated conductor could be procured. If the inorganic component was above 30% by weight, furthermore, the via of a small diameter of 100 μm or less was fallen into a poor shape, even after a process of $CO_2$ laser and UV laser, causing problems in terms of connection reliability; additionally, such a resin composition had poor laser piercing property, for example, the resin composition caused the reduction of laser processing rate. If even a scrubbable resin composition containing a scrubbing component at 40% by weight or more was prepared as an adhesive film of a two-layer structure as in Example 4 or 5, the via strength and reliability could be established concurrently in a simple manner.

By the method of the present invention, an inter-laminar adhesive film for multi-layer printed wiring boards can be prepared, having excellent embedding property of the internal-layer circuit and excellent surface smoothness, and by using the adhesive film, a multi-layer printed wiring board can be produced at a build-up process at a high productivity.

Obviously, additional modifications and variations of the present invention are possible in light of the above teachings. It is therefore to be understood that within the scope of the appended claims, the invention may be practiced otherwise than as specifically described herein.

We claim:

1. A process for producing a multi-layer printed wiring board comprising the steps of:
   providing an internal-layer circuit board having an electrical conductor pattern thereon;
   providing an inter-laminar adhesive film, which comprises a support film base layer and a layer of a resin composition that is solid at ambient temperature;
   laminating said inter-laminar adhesive film to the internal-layer circuit board by contacting the surface of the internal-layer circuit board with the resin composition layer under lamination conditions, including a lamination temperature and pressure, thereby adhering the inter-laminar adhesive film to the surface of the internal-layer circuit board;
   wherein said resin composition comprises:
   (A) a liquid epoxy resin;
   (B) a polyfunctional epoxy resin with a softening point higher than the lamination temperature and having two or more epoxy groups per epoxy resin molecule; and
   (C) a latent epoxy curing agent capable of initiating a reaction at a temperature higher than the lamination temperature.

2. The process of claim 1, wherein said resin composition further comprises from 10 to 55% by weight of the composition of a liquid resin other than the liquid epoxy resin (A) or an organic solvent or a combination thereof.

3. The process according to claim 1, wherein the resin composition further comprises (i) at least one scrubbing component selected from the group consisting of rubber components, amino resins, inorganic fillers, and organic fillers, or (ii) at least one electroless plating catalyst selected from the group consisting of metals, metal compounds and inorganic compositions having metal or metal compounds absorbed or coated thereon, or a combination thereof, wherein the scrubbing component constitutes 5 to 40% by weight of the resin composition, and wherein the said electroless plating catalyst constitutes 0.05 to 3% by weight of the resin composition.

4. The process according to claim 1, wherein said inter-laminar adhesive film comprises a layer of a scrubbable resin composition solid at ambient temperature interposed between said support film base layer and said solid resin composition, wherein said scrubbable resin composition comprises:
   (a) a polyfunctional epoxy resin having two or more epoxy group per epoxy resin molecule;
   (b) an epoxy curing agent; and
   (c) at least one scrubbing component selected from the group consisting of rubber components, amino resins, inorganic fillers, and organic fillers.

5. The process of claim 4, wherein said scrubbable resin composition further comprises an organic solvent.

6. The process according to claim 4, wherein said scrubbable resin composition further comprises at least one electroless plating catalyst selected from the group consisting of metals, metal compounds, and inorganic compositions having metal or metal compounds absorbed or coated thereon.

7. The process according to claim 1, wherein said inter-laminar adhesive film comprises a layer of an additive resin composition solid at ambient temperature interposed between said support film base layer an said solid resin composition, wherein the additive resin composition comprises:
   (a) a polyfunctional epoxy resin having two or more epoxy group per epoxy resin molecule;
   (b) an epoxy curing agent; and
   (c) at least one electroless plating catalyst selected from the group consisting of metals, metal compounds, and inorganic compositions having metal or metal compounds absorbed or coated thereon.

8. The process according to claim 1, wherein said process further comprises:
   (i) peeling off the support base film layer and optionally thermally curing the resin composition subsequent to laminating the inter-laminar adhesive film, and
   (ii) laminating a copper foil on the optionally thermally cured adhesive layer by the use of heat or adhesive.

9. The process according to claim 1, wherein said lamination conditions are selected from temperatures for contact bonding in the range of from 70 to 200° C., pressure in the range of from 1 to 10 kgf/cm² and reduced pressures of 1 to 20 mmHg.

10. The process according to claim 9, wherein said process further comprises:
   (i) peeling off the support base film and optionally, thermally curing the resin composition subsequent to laminating the inter-laminar adhesive film; and
   (ii) laminating a copper foil on the optionally thermally cured adhesive layer by the use of heat or adhesive.

11. The process according to claim 9, wherein said process further comprises:
   (i) peeling off the support base film and optionally, thermally curing the resin composition subsequent to laminating the inter-laminar adhesive film;
   (ii) piercing the optionally cured resin composition by means of laser or drill;
   (iii) scrubbing the surface of the optionally cured resin composition by a dry process and optionally a wet process; and
   (iv) forming a conductor layer as an upper layer thereof by dry plating and optionally wet plating.

12. The process according to claim 1, wherein said process further comprises:
   (i) peeling off the support base film and optionally thermally curing the resin composition subsequent to laminating the inter-laminar adhesive film;
   (ii) piercing the optionally cured resin composition by means of laser or drill;
   (iii) scrubbing the surface of the optionally cured resin composition by a dry process and optionally, a wet process; and
   (iv) forming a conductor layer as an upper layer thereof by dry plating and optionally wet plating.

13. The process of claim 1, wherein the lamination is carried out by vacuum laminator.

14. The process of claim 1, wherein the lamination is carried out together with filling the resin composition in a superficial via holes and/or through-holes.

15. The process of claim 1, wherein the lamination is carried out together with filling the resin composition in a superficial via holes and/or through-holes by vacuum laminator.

16. The process of claim 1, wherein said resin composition further comprises from 10 to 55% by weight of the composition of a liquid resin other than the liquid epoxy resin (A) or an organic solvent or a combination thereof, and the lamination is carried out by vacuum laminator.

17. The process of claim 1, wherein said resin composition further comprises from 10 to 55% by weight of the composition of a liquid resin other than the liquid epoxy resin (A) or an organic solvent or a combination thereof, and the lamination is carried out together with filling the resin composition in a superficial via holes and/or through-holes.

18. The process of claim 1, wherein said resin composition further comprises from 10 to 55% by weight of the composition of a liquid resin other than the liquid epoxy resin (A) or an organic solvent or a combination thereof, the lamination is carried out together with filling the resin composition in a superficial via holes and/or through-holes by vacuum laminator.

19. A process for producing a multi-layer printed wiring board comprising the steps of:

providing an internal-layer circuit board having an electric conductor pattern thereon;

providing an inter-laminar adhesive film, which comprises a support film base layer and a resin composition that is solid at ambient temperature;

laminating said inter-laminar adhesive film to the internal-layer circuit board by contacting the surface of the internal-layer circuit board with the resin composition layer under laminating conditions, including a lamination temperature and pressure, thereby adhering the inter-laminar adhesive film to the surface of the internal-layer circuit board;

wherein said resin composition comprises:
   (A) a liquid epoxy resin;
   (B) a polyfunctional epoxy resin with a softening point lower the lamination temperature and having two or more epoxy groups per epoxy resin molecule;
   (C) a latent epoxy curing agent capable of initiating a reaction at a temperature higher than the lamination temperature; and
   (D) a binder polymer with a weight average molecular weight within range of 5,000 to 100,000.

20. The process of claim 19, wherein said resin composition further comprises from 10 to 55% by weight of a liquid resin other than the liquid epoxy resin (A) or an organic solvent or a combination thereof; and wherein component (D) constitute from 5 to 50% by weight of the composition.

21. The process of claim 19, wherein the lamination is carried out by vacuum laminator.

22. The process of claim 19, wherein the lamination is carried out together with filling the resin composition in a superficial via holes and/or through-holes.

23. The process of claim 19, wherein the lamination is carried out together with filling the resin composition in a superficial via holes and/or through-holes by vacuum laminator.

24. The process of claim 19, wherein said resin composition further comprises from 10 to 55% by weight of the composition of a liquid resin other than the liquid epoxy resin (A) or an organic solvent or a combination thereof, and the lamination is carried out by vacuum laminator.

25. The process of claim 19, wherein said resin composition further comprises from 10 to 55% by weight of the composition of a liquid resin other than the liquid epoxy resin (A) or an organic solvent or a combination thereof, and the lamination is carried out together with filling the resin composition in a superficial via holes and/or through-holes.

26. The process of claim 19, wherein said resin composition further comprises from 10 to 55% by weight of the composition of a liquid resin other than the liquid epoxy resin (A) or an organic solvent or a combination thereof, the lamination is carried out together with filling the resin composition in a superficial via holes and/or through-holes by vacuum laminator.

27. A multi-layer printed wiring board produced by the process of claim 1.

28. A multi-layer printed wiring board produced by the process of claim 2.

29. A multi-layer printed wiring board produced by the process of claim 19.

30. A multi-layer printed wiring board produced by the process of claim 4.

31. A multi-layer printed wiring board produced by the process of claim 7.

32. A multi-layer printed wiring board produced by the process of claim 8.

33. A multi-layer printed wiring board produced by the process of claim 9.

34. A multi-layer printed wiring board produced by the process of claim 12.

35. A multi-layer printed wiring board produced by the process of claim 20.

* * * * *